United States Patent
Ker et al.

(10) Patent No.: US 8,102,001 B2
(45) Date of Patent: Jan. 24, 2012

(54) INITIAL-ON SCR DEVICE FOR ON-CHIP ESD PROTECTION

(75) Inventors: Ming-Dou Ker, Hsinchu (TW);
Shih-Hung Chen, Taipei County (TW);
Kun-Hsien Lin, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/891,474

(22) Filed: Sep. 27, 2010

(65) Prior Publication Data
US 2011/0013326 A1  Jan. 20, 2011

Related U.S. Application Data

(62) Division of application No. 11/186,086, filed on Jul. 21, 2005, now Pat. No. 7,825,473.

(51) Int. Cl.
*H01L 23/62* (2006.01)
(52) U.S. Cl. ........ 257/355; 257/206; 257/360; 257/357; 257/361; 257/401; 257/E21.345; 257/E21.619; 257/E29.018; 257/E29.005; 257/E29.062; 361/56; 361/91.5; 361/111
(58) Field of Classification Search ............... 257/206, 257/360, 355, 357, 358, 361, 212, 401, E21.345, 257/E21.618, E21.619, E23.151, E27.031, 257/E29.018, E29.005, E29.062, E29.064; 361/91.5, 56, 111
See application file for complete search history.

(56) References Cited

U.S. PATENT DOCUMENTS

| | | | |
|---|---|---|---|
| 5,576,557 A | 11/1996 | Ker et al. | |
| 5,903,420 A | 5/1999 | Ham | |
| 5,945,713 A | 8/1999 | Voldman | |
| 6,011,681 A | 1/2000 | Ker et al. | |
| 6,015,992 A * | 1/2000 | Chatterjee et al. | 257/350 |
| 6,016,002 A | 1/2000 | Chen et al. | |
| 6,097,067 A | 8/2000 | Ouchi et al. | |
| 6,147,369 A | 11/2000 | Chen et al. | |
| 6,423,985 B1 * | 7/2002 | Yu | 257/107 |
| 6,465,283 B1 | 10/2002 | Chang et al. | |
| 6,521,952 B1 * | 2/2003 | Ker et al. | 257/360 |
| 6,538,266 B2 | 3/2003 | Lee et al. | |
| 6,882,009 B2 | 4/2005 | Ker et al. | |

(Continued)

OTHER PUBLICATIONS

Ker et al., "A Gate-Coupled PTLSCR/NTLSCR ESD Protection Circuit for Deep-Submicron Low-Voltage CMOS IC's" *IEEE Journal of Solid-State Circuits*, vol. 32, No. 1, pp. 38-51, Jan. 1997.

(Continued)

*Primary Examiner* — Meiya Li
(74) *Attorney, Agent, or Firm* — Alston & Bird LLP

(57) ABSTRACT

A semiconductor device for electrostatic discharge (ESD) protection includes a silicon controlled rectifier (SCR) including a semiconductor substrate, a first well formed in the substrate, a second well formed in the substrate, a first p-type region formed in the first well to serve as an anode, and a first n-type region partially formed in the second well to serve as a cathode, a p-type metal-oxide-semiconductor (PMOS) transistor formed in the first well including a gate, a first diffused region and a second diffused region separated apart from the first diffused region, a second n-type region formed in the first well electrically connected to the first diffused region of the PMOS transistor, and a second p-type region formed in the substrate electrically connected to the second diffused region of the PMOS transistor.

8 Claims, 17 Drawing Sheets

U.S. PATENT DOCUMENTS

| | | | |
|---|---|---|---|
| 7,012,307 B2 * | 3/2006 | Lin et al. | 257/360 |
| 7,064,393 B2 * | 6/2006 | Mergens et al. | 257/360 |
| 7,323,753 B2 | 1/2008 | Henmi et al. | |
| 2002/0122280 A1 | 9/2002 | Ker et al. | |
| 2003/0174452 A1 | 9/2003 | Chen et al. | |
| 2004/0042143 A1 | 3/2004 | Ker et al. | |
| 2004/0100745 A1 | 5/2004 | Chen et al. | |
| 2004/0100746 A1 | 5/2004 | Chen et al. | |
| 2004/0207017 A1 * | 10/2004 | Matsumoto et al. | 257/347 |
| 2004/0232492 A1 | 11/2004 | Ker et al. | |
| 2005/0133869 A1 | 6/2005 | Ker et al. | |

OTHER PUBLICATIONS

Russ et al., "GGSCR: GGNMOS Triggered Silicon Controlled Rectifiers for ESD Protection in Deep Submicron CMOS Processes" *Proc. of EOS/ESD Symp.*, 2001, pp. 22-31.

Ker et al., "Native-NMOS-Triggered SCR (NANSCR) for ESD Protection in 0.13-μm CMOS Integrated Circuits" *Proc. of IEEE Int. Reliability Physics Symp.*, 2004, pp. 381-386.

Ker et al., "Design of Negative Charge Pump Circuit with Polysilicon Diodes in a 0.25-μm CMOS Process" *Proc. of IEEE AP-ASIC Conf.*, 2002, pp. 145-148.

* cited by examiner

INITIAL-ON SCR DEVICE FOR ON-CHIP ESD PROTECTION

CROSS-REFERENCE TO RELATED APPLICATION

This application is a divisional of U.S. application Ser. No. 11/186,086, filed Jul. 21, 2005 now U.S. Pat. No. 7,825,473, the content of which is hereby incorporated herein in its entirety by reference.

BACKGROUND OF THE INVENTION

1. Technical Field of the Invention

The present invention relates generally to electrostatic discharge ("ESD") protection, and more particularly, to a silicon controlled rectifier ("SCR") device for on-chip ESD protection.

2. Description of the Related Art

Integrated circuits (IC's) and other semiconductor devices are extremely sensitive to high voltages that may be generated by contact with an electrostatic discharge ("ESD") event. As such, ESD protection devices are essential for integrated circuits. An ESD event generally results from the discharge of a high voltage potential of several kilovolts, and leads to pulses of high current of several amperes in a short duration of several tens of nanoseconds. An ESD event is generated within an IC by human contact with the leads of the IC or by electrically charged machinery being discharged in other leads of an IC. These electrostatic discharges may destroy the IC's during installation of the IC's into products.

ESD damage has become the main reliability issue for complementary metal-oxide-semiconductor ("CMOS") integrated circuit ("IC") products fabricated in nanoscale CMOS processes. On-chip ESD protection devices, such as n-type metal-oxide-semiconductor ("NMOS") transistors, p-type metal-oxide-semiconductor ("PMOS") transistors, field-oxide devices, diodes, parasitic bipolar junction transistors ("BJTs"), or silicon controlled rectifier ("SCR") devices, must be added into CMOS chips to achieve required ESD robustness. Generally, an ESD protection device is initially kept at an off state in a CMOS IC. FIGS. 1A and 1B are schematic diagrams illustrating operation of an initial-off ESD protection device 10. Referring to FIG. 1A, ESD protection device 10, electrically connected between a pad 12 of an IC (not shown) and a reference voltage level, is initially kept off. When pad 12 is zapped by an ESD pulse, ESD protection device 10 is triggered on by the overstress ESD voltage to conduct an ESD current $I_{ESD}$ from pad 12 to the reference voltage level. However, since the core circuits of the IC fabricated in nanoscale CMOS technology have relatively thin gate oxides, the initial-off ESD protection design may no longer be able to effectively protect the core circuits against an ESD event.

To protect core circuits of an IC with relatively thin gate oxides, the turn-on speed of an ESD protection device must be further enhanced. Furthermore, the trigger voltage of an ESD protection device must be reduced lower enough to quickly respond to an ESD event. Initial-on ESD protection devices have been proposed to effectively protect nanoscale-CMOS ICs from ESD events. FIGS. 2A, 2B and 2C are schematic diagrams illustrating operation of an initial-on ESD protection device 20. Referring to FIG. 2A, ESD protection device 20, electrically connected between a pad 22 of an IC (not shown) and a reference voltage level, is kept off during normal operation of the IC. Referring to FIG. 2B, however, ESD protection device 20 is turned on when the IC is floating. When pad 22 is zapped by an ESD pulse, ESD protection device 20, already at an on state, is able to quickly discharge ESD current $I_{ESD}$ from pad 22 to the reference voltage level.

In nanoscale-CMOS IC products, on-chip ESD protection devices are required to provide robust ESD protection in limited layout area to save the chip size. Silicon controlled rectifiers (SCRs) have been used for on-chip ESD protection for their superior area-efficient ESD robustness. However, SCR devices may be disadvantageous in high trigger voltage ($V_{t1}$), slow turn-on speed, and even latch-up issue. Many efforts have been made to address the disadvantages of SCR devices. A low voltage-triggered SCR ("LVTSCR") has been proposed to reduce the trigger voltage of SCR devices. An example of the LVTSCR can be found in U.S. Pat. No. 5,465,189 to Polgreen et al., entitled "Low Voltage Triggering Semiconductor Controlled Rectifiers." Moreover, advanced circuit techniques, for example, gate-coupled, substrate-triggered and GGNMOS-triggered techniques, have been proposed to enhance the turn-on speed of SCR devices. An example of the gate-coupled technique can be found in "A Gate-Coupled PTLSCR/NTLSCR ESD Protection Circuit for Deep-Submicron Low-Voltage CMOS IC's" by Ker et al., one of the inventors of the present application, IEEE Journal of Solid-State Circuits, vol.32, no.1, pp.38-51, January 1997. The substrate-triggered technique can be found, for example, in "Latchup-Free ESD Protection Design with Complementary Substrate-Triggered SCR Devices" by Ker et al., IEEE Journal of Solid-State Circuits, vol. 38, pp. 1380-1392, 2003. As to the GGNMOS-triggered technique, an example of which can be found in "GGSCR: GGNMOS Triggered Silicon Controlled Rectifiers for ESD Protection in Deep Submicron CMOS Processes" by Russ et al., Proc. of EOS/ESD Symp., 2001, pp. 22-31. The above-mentioned SCR designs, however, still use initial-off ESD devices, and therefore may not be fast enough to respond to an ESD event.

In order to further enhance the turn-on speed, a native-NMOS-triggered SCR ("NANSCR") has been proposed to achieve more efficient ESD protection for nanoscale-CMOS ICs. An example of the NANSCR can be found in "Native-NMOS-Triggered SCR (NANSCR) for ESD Protection in 0.13-µm CMOS Integrated Circuits" by Ker et al., Proc. of IEEE Int. Reliability Physics Symp., 2004, pp. 381-386. In this NANSCR, a native device, referring to a semiconductor device of which the substrate is undoped, is used to assume the "initial-on" function. To keep such NANSCR in an off state during normal operation of an IC, an on-chip negative-bias generator may be required. Such an on-chip negative-bias generator has been proposed in "Design of Negative Charge Pump Circuit with Polysilicon Diodes in a 0.25-µm CMOS Process" by Ker et al., Proc. of IEEE AP-ASIC Conf., 2002, pp. 145-148. Since additional processes are required to fabricate the on-chip negative-bias generator, the NANSCR may have limitation in practical applications of general CMOS ICs.

It is therefore desirable to have an initial-on SCR device for on-chip electrostatic discharge ("ESD") protection that has a low trigger voltage, fast turn-on speed and latch-up immunity. Furthermore, the initial-on SCR device may be implemented in CMOS processes without incorporating any native devices.

BRIEF SUMMARY OF THE INVENTION

The present invention is directed to a PMOS-triggered SCR device and a method that obviate one or more problems resulting from the limitations and disadvantages of the prior art.

In accordance with an embodiment of the present invention, there is provided a semiconductor device for electrostatic discharge (ESD) protection that comprises a silicon controlled rectifier (SCR) including a semiconductor substrate, a first well formed in the substrate, a second well formed in the substrate, a first p-type region formed in the first well to serve as an anode, and a first n-type region partially formed in the second well to serve as a cathode, a p-type metal-oxide-semiconductor (PMOS) transistor formed in the first well including a gate, a first diffused region and a second diffused region separated apart from the first diffused region, a second n-type region formed in the first well electrically connected to the first diffused region of the PMOS transistor, and a second p-type region formed in the substrate electrically connected to the second diffused region of the PMOS transistor.

Also in accordance with the present invention, there is provided a semiconductor device for electrostatic discharge (ESD) protection that comprises a semiconductor substrate, an n-type well formed in the substrate, a p-type metal-oxide-semiconductor (PMOS) transistor formed in the n-type well including a gate, a first diffused region and a second diffused region separated apart from the first diffused region, an n-type region formed in the n-type well electrically connected to the first diffused region of the PMOS transistor, and a p-type region formed in the substrate electrically connected to the second diffused region of the PMOS transistor, wherein the gate of the PMOS transistor is kept at a reference voltage level to keep the PMOS transistor at an on state before an ESD event occurs.

Further in accordance with the present invention, there is provided a semiconductor device for electrostatic discharge (ESD) protection that comprises a silicon controlled rectifier (SCR) including a semiconductor substrate and a well formed in the substrate, a p-type metal-oxide-semiconductor (PMOS) transistor formed in the well including a gate, and a detection circuit electrically connected to the gate of the PMOS transistor for keeping the PMOS transistor at an on state before an ESD event occurs.

Still in accordance with the present invention, there is provided a method of providing electrostatic discharge (ESD) protection that comprises providing a silicon controlled rectifier (SCR) including a semiconductor substrate and a well formed in the substrate, providing a p-type metal-oxide-semiconductor (PMOS) transistor formed in the well of the SCR including a gate, a first diffused region and a second diffused region spaced apart from the first diffused region, providing an n-type region formed in the well being electrically connected to the first diffused region of the PMOS transistor, providing a p-type region formed in the substrate being electrically connected to the second diffused region of the PMOS transistor, and keeping the PMOS transistor at an on state before an ESD event occurs.

Yet still in accordance with the present invention, there is provided a method of providing electrostatic discharge (ESD) protection that comprises providing a silicon controlled rectifier (SCR) including a semiconductor substrate, a well formed in the substrate, an anode formed in the well, and a cathode, providing a p-type metal-oxide-semiconductor (PMOS) transistor formed in the well of the SCR including a gate, a first diffused region and a second diffused region spaced apart from the first diffused region, providing an n-type region formed in the well being electrically connected to the first diffused region of the PMOS transistor, providing a p-type region formed in the substrate being electrically connected to the second diffused region of the PMOS transistor, keeping the PMOS transistor at an on state before an ESD event occurs, triggering a first current in the well flowing through the n-type region in response to an ESD event, triggering a second current in the substrate flowing through the p-type region in response to the first current, and discharging an ESD current due to the ESD event from the anode to the cathode.

Further in accordance with the present invention, there is provided a method of providing electrostatic discharge (ESD) protection that comprises providing an ESD clamp device including a silicon controlled rectifier (SCR) further including a semiconductor substrate and a well formed in the substrate, a p-type metal-oxide-semiconductor (PMOS) transistor formed in the well of the SCR including a gate, a first diffused region and a second diffused region spaced apart from the first diffused region, an n-type region formed in the well being electrically connected to the first diffused region of the PMOS transistor, and a p-type region formed in the substrate being electrically connected to the second diffused region of the PMOS transistor, keeping the PMOS transistor at an on state before an ESD event occurs, triggering a first current in the well in response to an ESD event, and triggering a second current in the substrate in response to the first current.

Additional features and advantages of the present invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL
VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

DETAILED DESCRIPTION OF THE INVENTION

The present invention provides an initial-on silicon controlled rectifier ("SCR") that has a relatively low trigger voltage and a relatively fast turn-on speed for on-chip electrostatic discharge ("ESD") protection. Furthermore, the initial-on SCR device has a holding voltage high enough to prevent latch-up. The initial-on SCR device may be implemented by PMOS-triggered technique without modifying general CMOS processes. For example, the initial-on SCR can be realized in a 0.25-μm CMOS process.

Figures 1A, 1B:
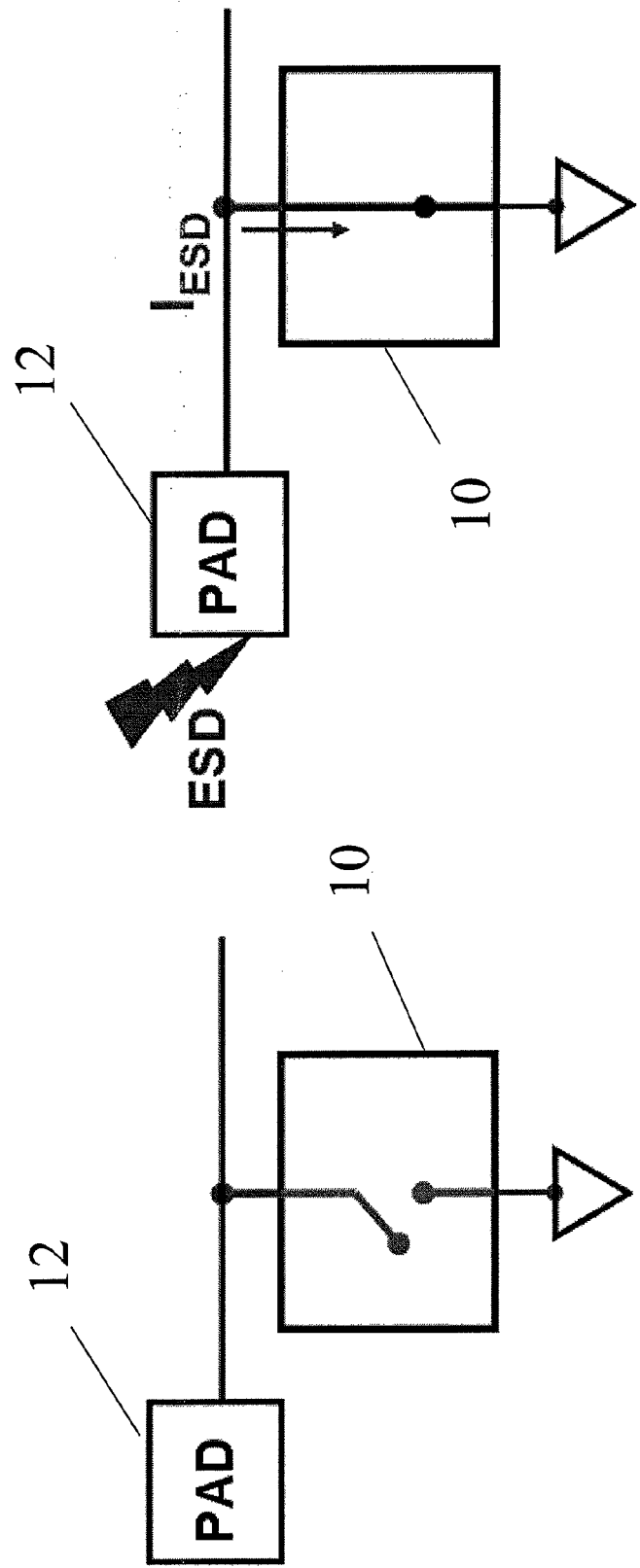
FIGS. 1A and 1B are schematic diagrams illustrating the operation of an initial-off electrostatic discharge ("ESD") protection device.
Figures 2A, 2B, 2C:
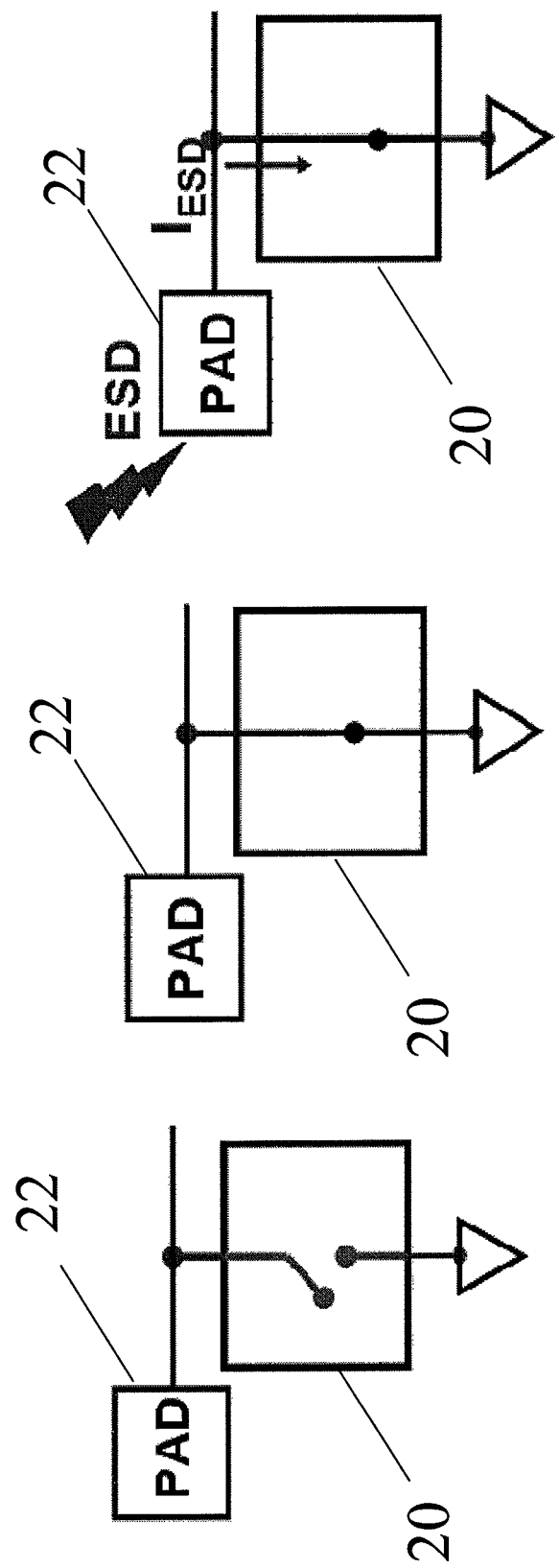
FIGS. 2A, 2B and 2C are schematic diagrams illustrating operation of an initial-on ESD protection device.
Figure 3A:
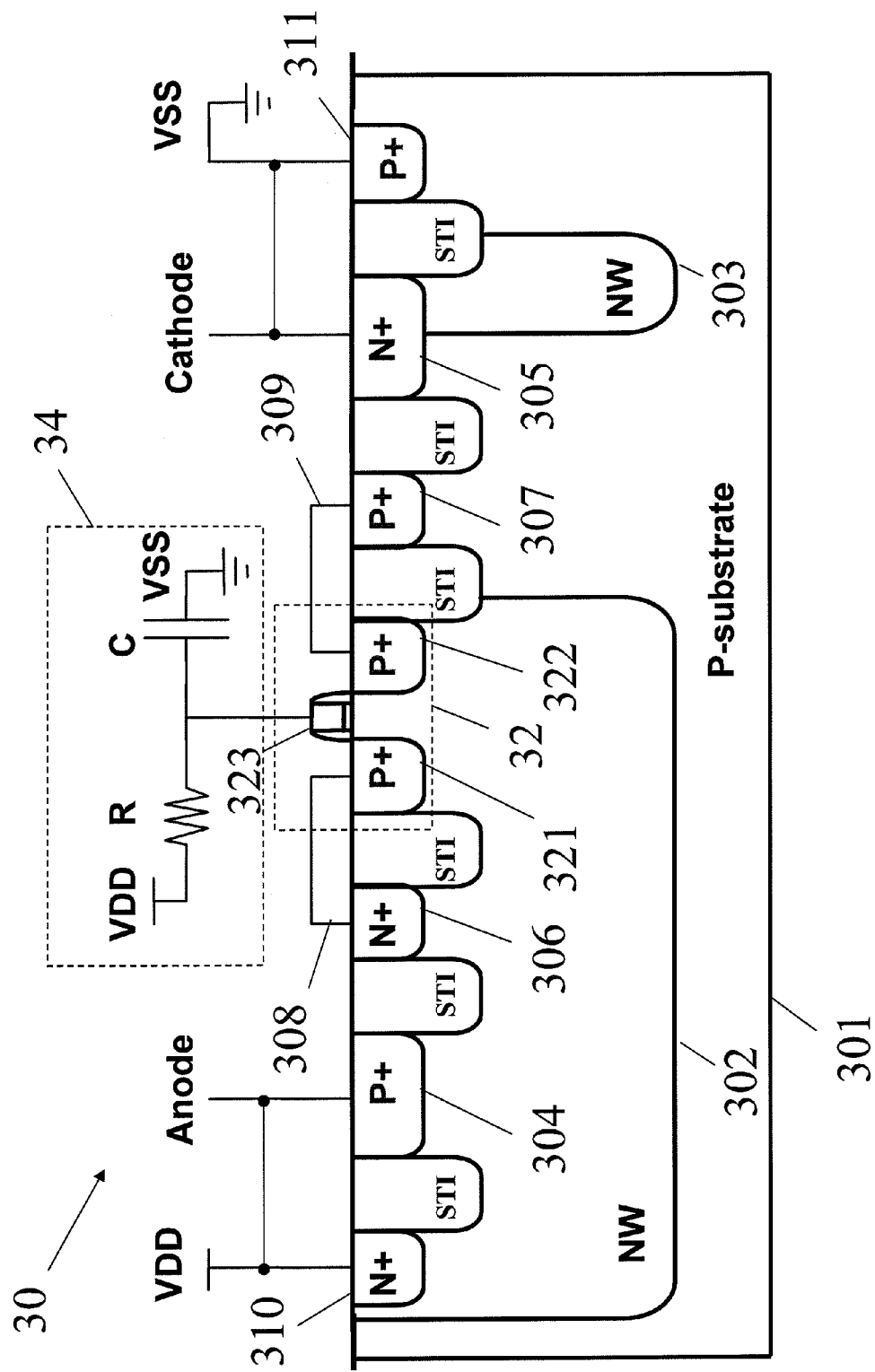
FIG. 3A is a cross-sectional view of a silicon controlled rectifier ("SCR") device in accordance with one embodiment of the present invention.

FIG. 3A is a cross-sectional view of an SCR device 30 in accordance with one embodiment of the present invention. Referring to FIG. 3A, a PMOS transistor 32 is embedded in SCR device 30 to assume an initial-on function together with an ESD detection circuit 34 for ESD protection. SCR device 30 includes a p-type substrate 301, a first n-type well (N-well) region 302 formed in substrate 301, a heavily doped p-type (P+) region 304 formed in N-well 302 to serve as an anode, and a heavily doped n-type (N+) region 305 formed partially in a second N-well 303 to serve as a cathode. PMOS transistor 32, formed in first N-well 302, includes a first diffused region 321, a second diffused region 322 and a gate 323. First diffused region 321, which serves as a source, is electrically connected by a first conductive line 308 to an N+ region 306 formed in first N-well 302. Second diffused region 322, which serves as a drain, is electrically connected by a second conductive line 309 to a P+ region 307 formed in substrate 301. N+ region 306 and P+ region 307, functioning to respectively serve as a first trigger node and a second trigger node during an ESD event, enhance the turn-speed of SCR device 30, which will be described in detail by reference to FIG. 3B. Gate 323 is coupled between a resistor denoted as R and a capacitor denoted as C of ESD detection circuit 34. The resistor R includes one end coupled to a first power line $V_{DD}$. The capacitor C includes one end coupled to a second power line $V_{SS}$, and the other end coupled to the other end of the resistor R and gate 323. Anode 304, together with another N+ region 310 formed in first N-well 302, is coupled to $V_{DD}$. Cathode 305, together with another P+ region 311 formed in substrate 301, is coupled to $V_{SS}$. SCR device 30 may further include shallow trench isolation ("STI") structures for electrical isolation between N+ and P+ regions.

Figure 3B:
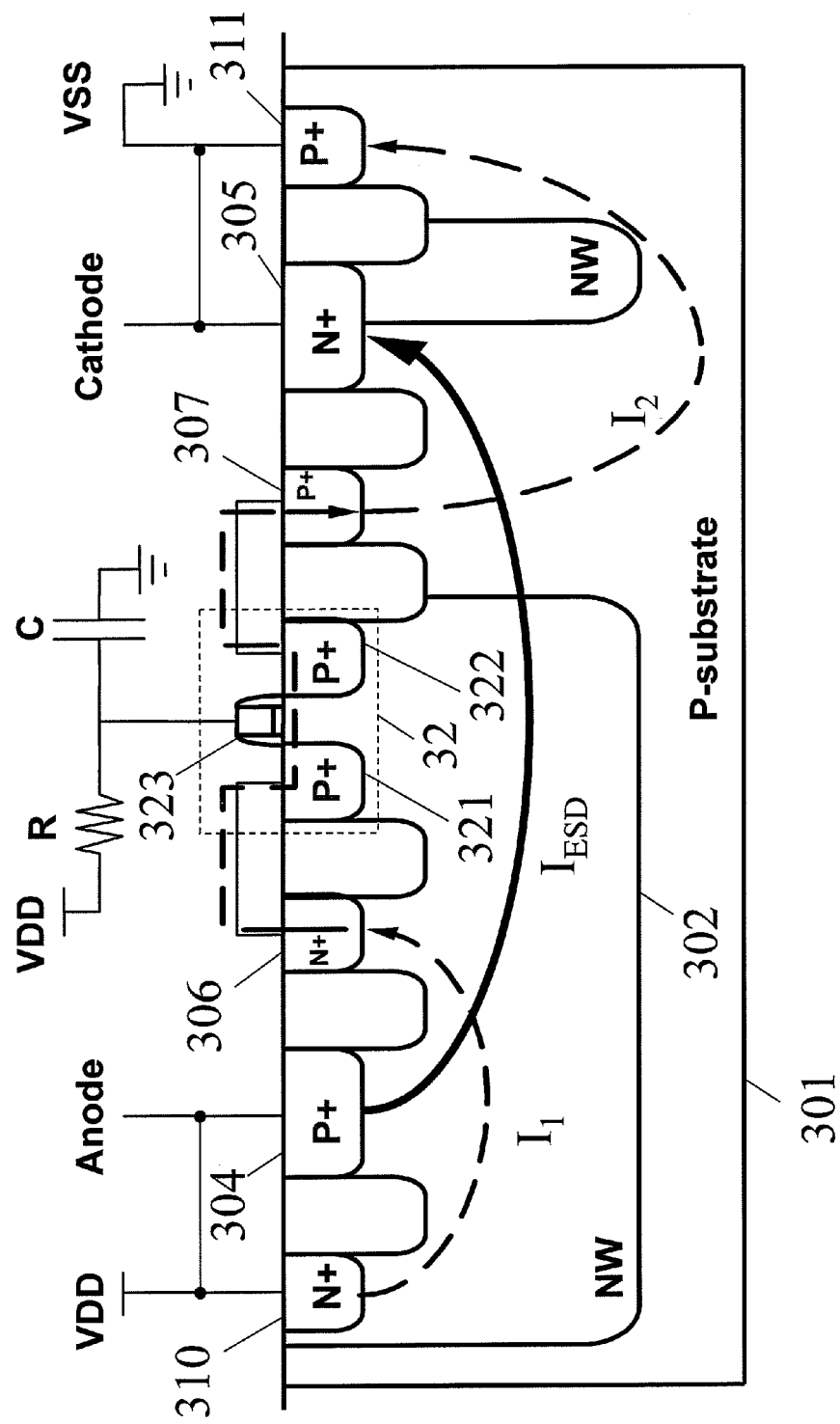
FIG. 3B is a diagram illustrating the operation of the SCR device shown in FIG. 3A.

FIG. 3B is a diagram illustrating the operation of SCR device 30 shown in FIG. 3A. Before an ESD event occurs, the whole IC is in a state of equivalent potential, i.e., floating. All of the nodes in the IC are deemed to be coupled to a ground level through the second power line $V_{SS}$. The voltage level at gate 323 of PMOS transistor 32 is initially kept at a zero voltage level, which turns on PMOS transistor 32, and in turn triggers SCR device 30 when an ESD event occurs at anode 304. A first triggering current $I_1$ is generated in N well 302 in response to the ESD event. First current $I_1$ flows from N+ region 310 to first trigger node 306, and continues to flow through PMOS transistor 32 to second trigger node 307, which then triggers a second triggering current $I_2$. Second triggering current $I_2$ flows from second trigger node 307 to P+ region 311. Once second triggering current $I_2$ is generated, SCR device 30 is turned on to discharge an ESD current $I_{ESD}$, from anode 304 to cathode 305.

During normal circuit operation, all of the nodes of the IC are electrically connected between first power line $V_{DD}$ and second power line $V_{SS}$. Gate 323 of embedded PMOS transistor 32 is biased at a voltage level of $V_{DD}$, which turns off PMOS transistor 32. ESD detection circuit 34 functions to distinguish between IC's normal circuit operation and an ESD event. PMOS transistor 32 is kept off during normal operation. When an ESD event occurs, the voltage level of source 321 of PMOS transistor 32 is higher than $V_{DD}$. At this moment, the voltage level of gate 323 of PMOS transistor 32 has not risen to $V_{DD}$ due to the RC delay. Since the gate to source voltage $V_{GS}$ is smaller than zero, PMOS transistor 32 is turned on, which triggers SCR device 30 to discharge the ESD current. In one embodiment according to the present invention, the RC time constant ranges from approximately 0.1 to 1 μs, greater than the duration of an ESD event generally ranging from 2 ns to 10 ns.

Figure 4:
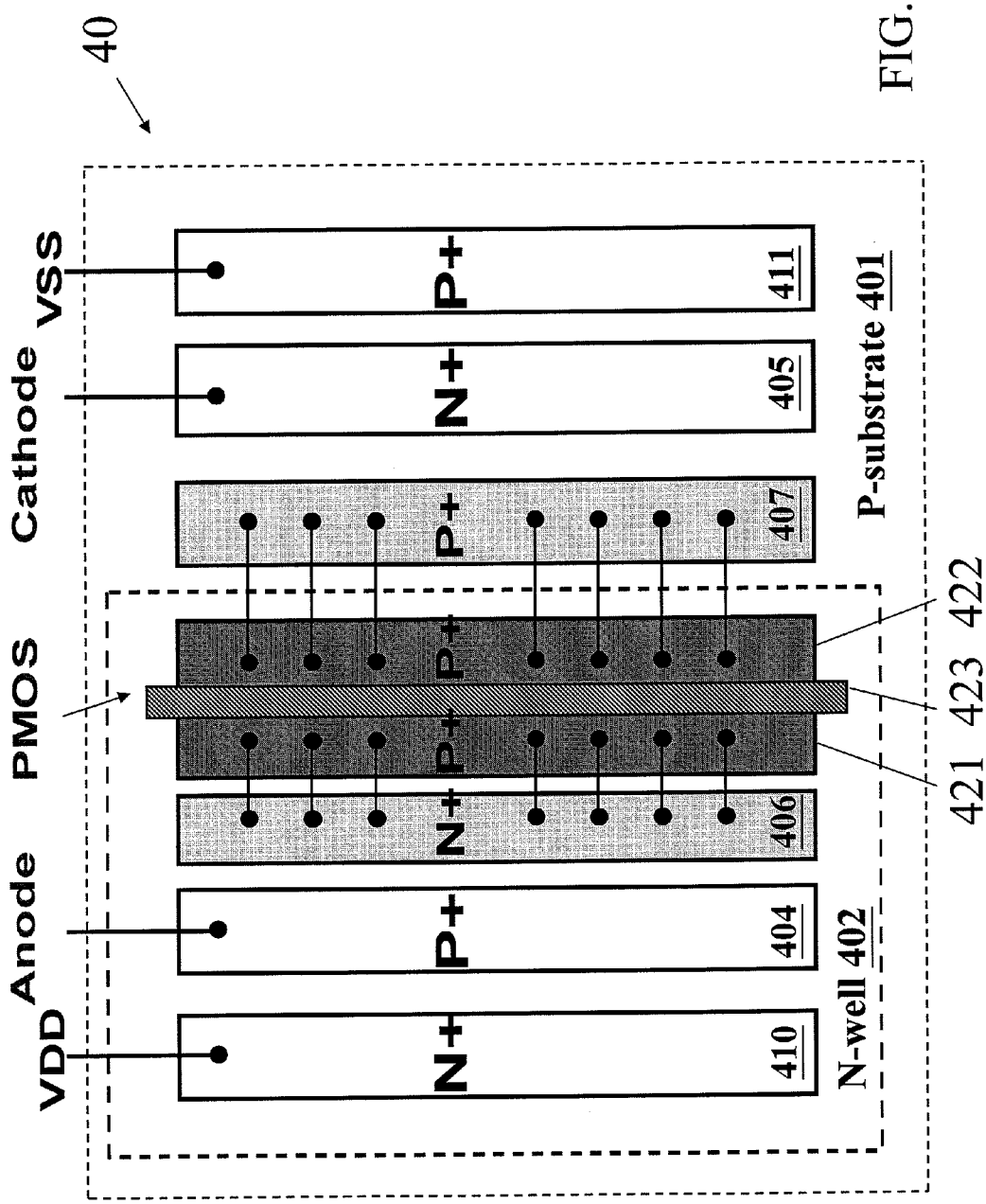
FIG. 4 is a layout diagram of an SCR device in accordance with one embodiment of the present invention.

FIG. 4 is a layout diagram of an SCR device 40 in accordance with one embodiment of the present invention. Referring to FIG. 4, by also cross-reference to FIG. 3A, SCR device 40 includes a substrate 401, an N-well region 402 formed in substrate 401, an embedded PMOS transistor denoted as PMOS, an anode region 404 and a cathode region 405. The PMOS transistor includes a source region 421, a drain region 422 and a gate region 423. SCR device 40 further includes an N+ region 406 disposed between anode region 404 and source region 421 to serve as a first trigger node, and a P+ region 407 disposed between cathode region 405 and drain region 422 to serve as a second trigger node. First trigger node 406 and another N+ region 410, which are formed in N-well 402, together define a path for a first triggering current when SCR is triggered. Second trigger node 407 and another P+ region 411, which are formed outside N-well 402 in substrate 401, together define a path for a second triggering current.

Figure 5:
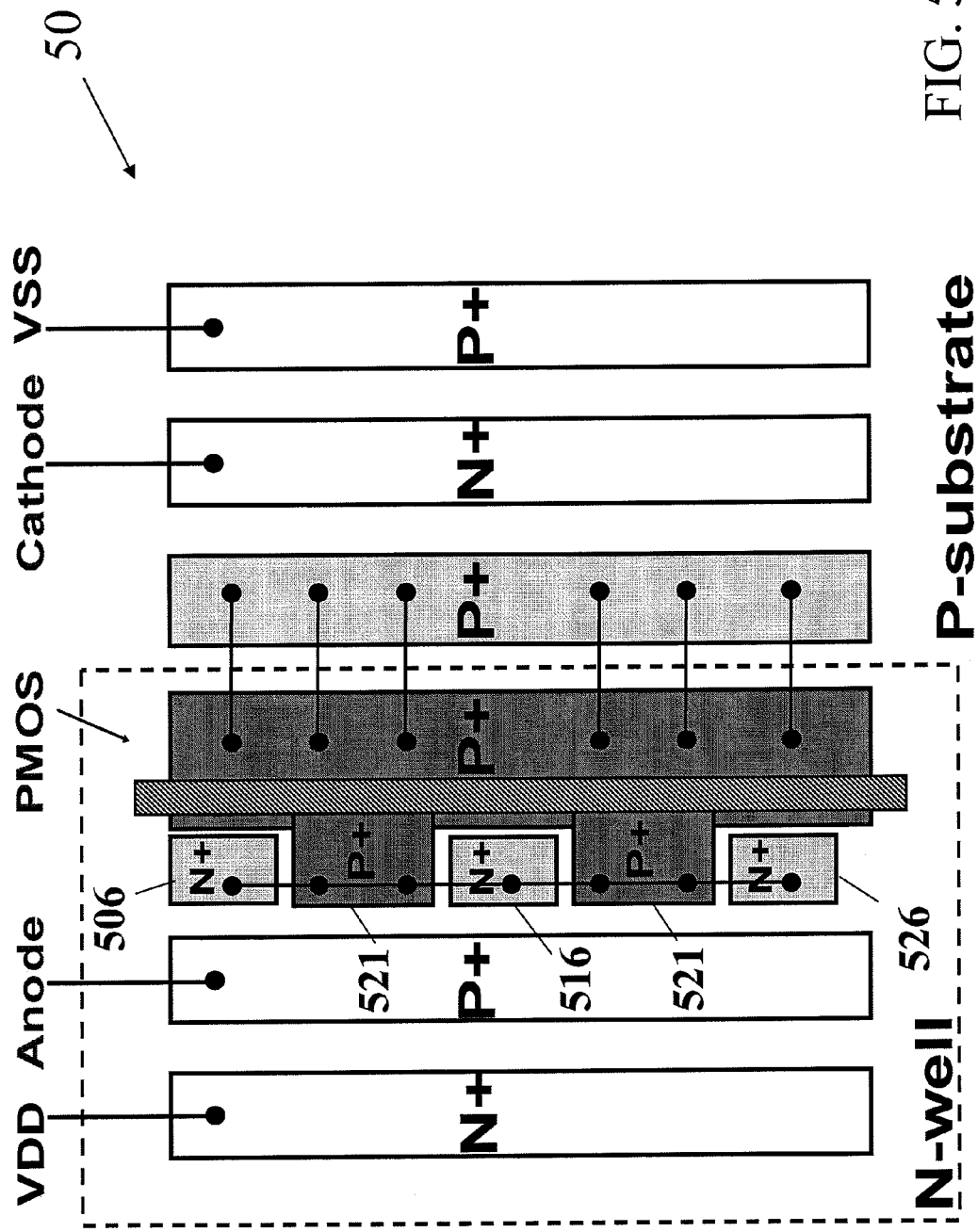
FIG. 5 is a layout diagram of an SCR device in accordance with another embodiment of the present invention.

FIG. 5 is a layout diagram of an SCR device 50 in accordance with another embodiment of the present invention. Referring to FIG. 5, SCR device 50 is similar to SCR 40 shown in FIG. 4 in layout except a first trigger node. Unlike first trigger node 406 shown in FIG. 4 being an integral region, the first trigger node of SCR device 50 includes a plurality of regions 506, 516 and 526 separated apart from each other by a source region 521. Consequently, the area of first trigger regions 506, 516 and 526 plus source region 521 is smaller than that of first trigger node 406 plus source region 421 shown in FIG. 4, advantageously resulting in a decrease in device size.

Figure 6:
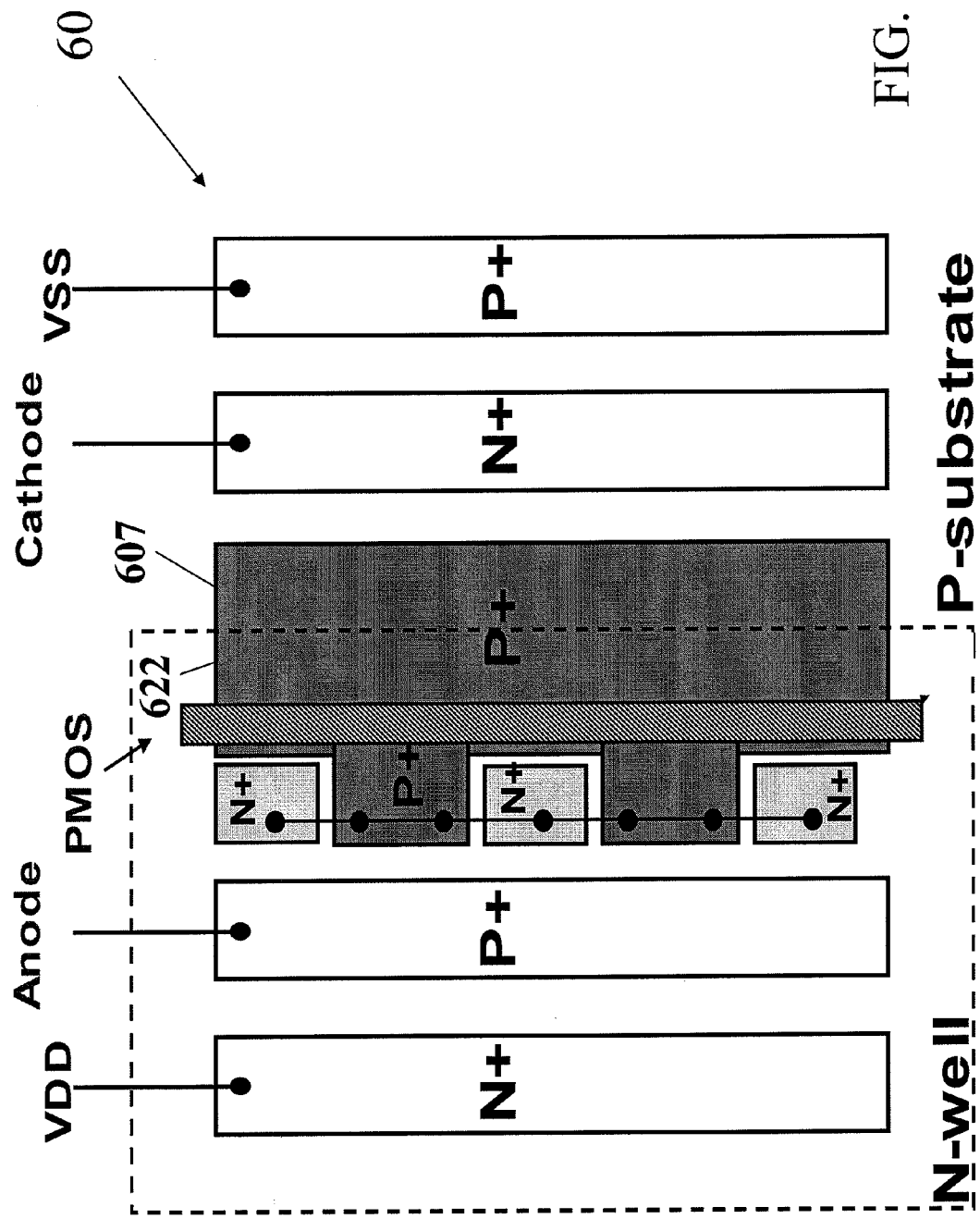
FIG. 6 is a layout diagram of an SCR device in accordance with yet another embodiment of the present invention.

FIG. 6 is a layout diagram of an SCR device 60 in accordance with yet another embodiment of the present invention. Referring to FIG. 6, SCR device 60 is similar to SCR 50 shown in FIG. 5 in layout except a drain region 622 and a second trigger node 607. Unlike the drain region and second trigger node of SCR device 50 formed in individual regions separated by an STI structure, drain region 622 and second trigger node 607 are formed in an integral region. However, drain region 622 is disposed in an N-well formed in a substrate, while second trigger node 607 is disposed outside the N-well in the substrate. Since an STI structure is eliminated, the device size is advantageously decreased.

Figure 7:
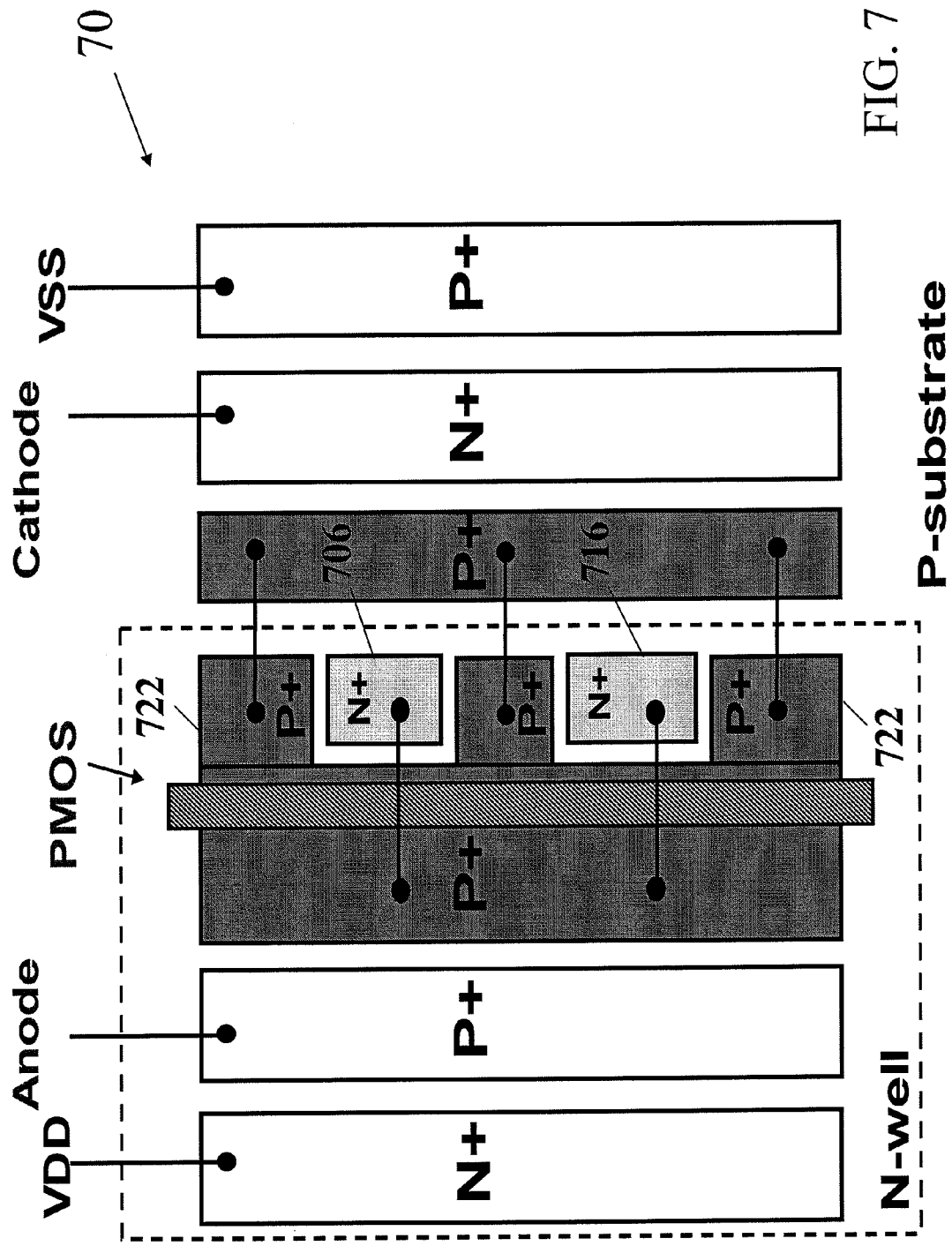
FIG. 7 is a layout diagram of an SCR device in accordance with still another embodiment of the present invention.

FIG. 7 is a layout diagram of an SCR device 70 in accordance with still another embodiment of the present invention. Referring to FIG. 7, SCR device 70 is similar to SCR 40 shown in FIG. 4 in layout except a first trigger node. Unlike first trigger node 406 shown in FIG. 4 being an integral region, the first trigger node of SCR device 70 includes a plurality of regions 706 and 716 separated apart from one another by a drain region 722. Consequently, the area of first trigger regions 706 and 716 plus drain region 722 is smaller than that of first trigger node 406 plus drain region 422 shown in FIG. 4, advantageously resulting in a decrease in device size.

Figure 8:
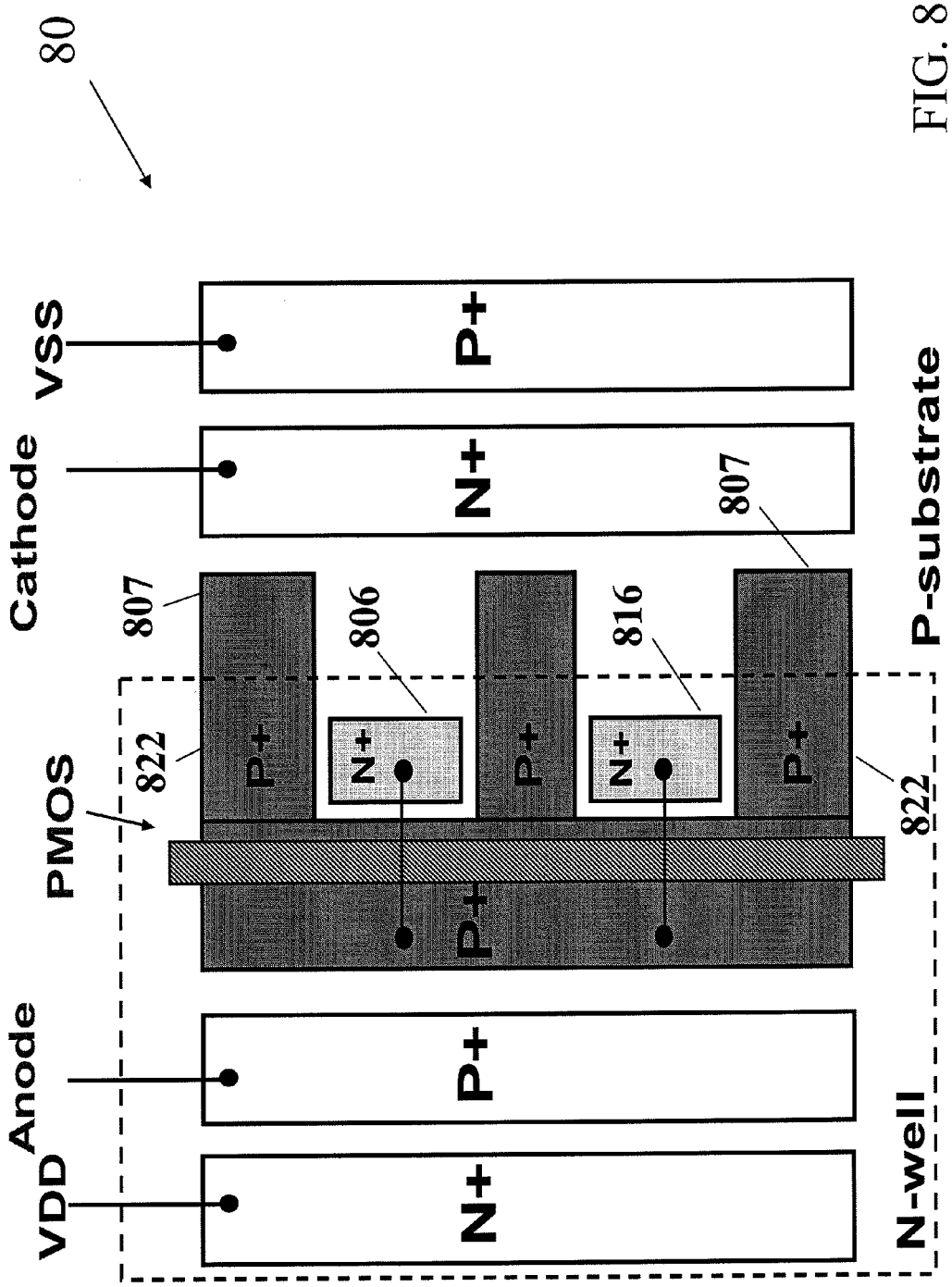
FIG. 8 is a layout diagram of an SCR device in accordance with yet still another embodiment of the present invention.

FIG. 8 is a layout diagram of an SCR device 80 in accordance with yet still another embodiment of the present invention. Referring to FIG. 8, SCR device 80 is similar to SCR 70 shown in FIG. 7 in layout except a drain region 822 and a second trigger node 807. Unlike the drain region and second trigger node of SCR device 70 formed in separate regions separated by an STI structure, drain region 822 and second trigger node 807 are formed in an integral region. However, drain region 822 is disposed in an N-well formed in a substrate, while second trigger node 807 is disposed outside the N-well in the substrate. Since an STI structure is eliminated, the device size is advantageously further decreased.

Figure 9:
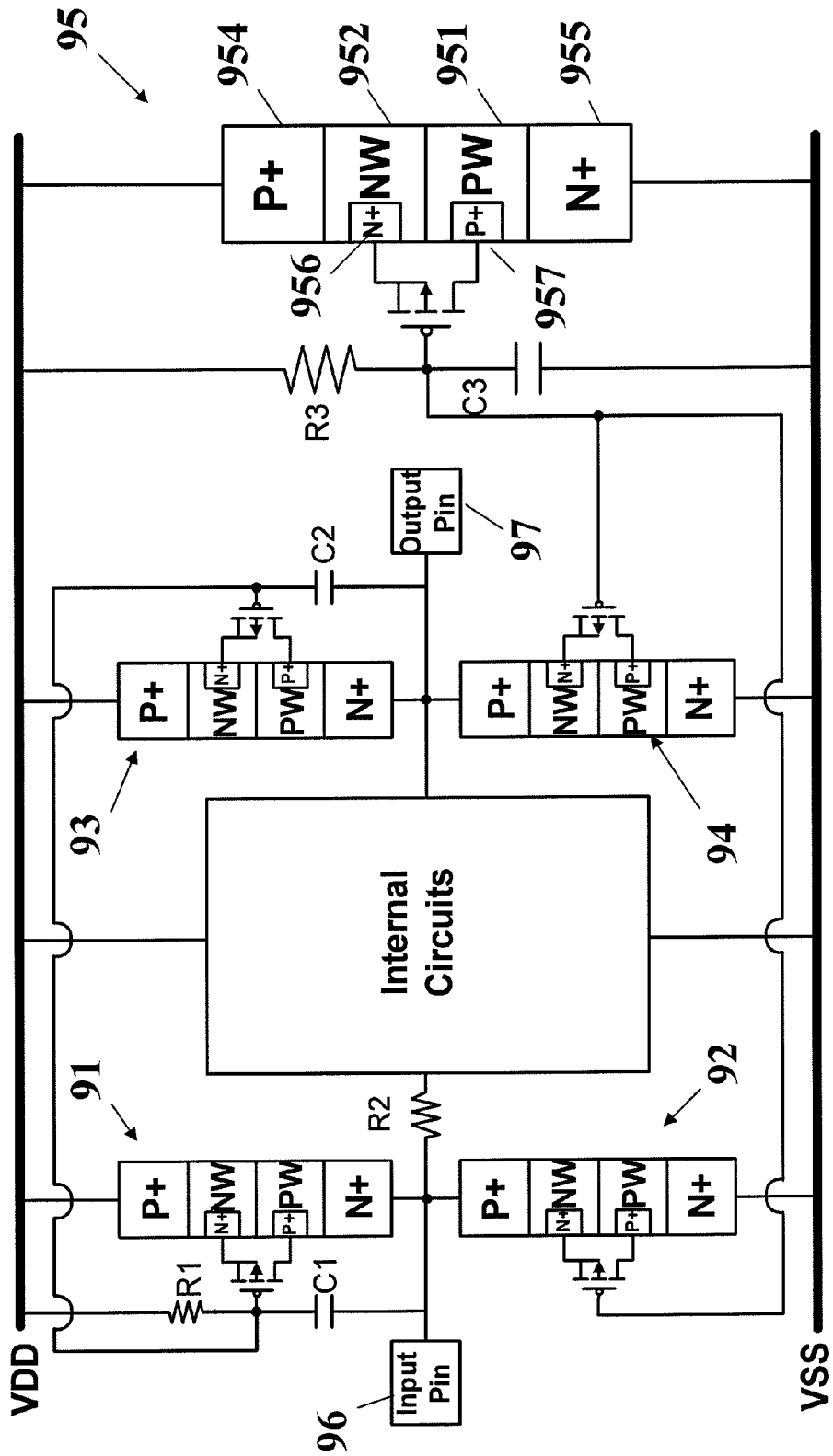
FIG. 9 is a schematic diagram of an ESD protection architecture in accordance with one embodiment of the present invention.

FIG. 9 is a schematic diagram of an ESD protection architecture in accordance with one embodiment of the present invention. Referring to FIG. 9, ESD clamp devices 91, 92, 93, 94 and 95 are employed to protect the internal circuits of an IC from an ESD event. Each of ESD clamp devices 91, 92, 93, 94 and 95 includes an SCR device according to the present invention shown in the above-mentioned embodiments. As an example, fifth ESD clamp device 95 includes an SCR device further including a substrate 951, an N-well 952, an anode 954 and a cathode 955, a PMOS transistor (not numbered) embedded in the SCR and a detection circuit (not numbered) further including a resistor R3 and a capacitor C3. The PMOS transistor includes a source and a drain coupled to a first trigger node 956 and a second trigger node 957 of the SCR, respectively.

First ESD clamp device 91 is connected between first power line $V_{DD}$ and an input pin 96 of an IC. Second ESD clamp device 92 is connected between second power line $V_{SS}$ and input pin 96. First and second ESD clamp devices 91 and 92 function to protect the internal circuits of the IC from an ESD event occurring on input pin 96. Likewise, third ESD clamp device 93 is connected between $V_{DD}$ and an output pin 97 of the IC. Fourth ESD clamp device 94 is connected between $V_{SS}$ and output pin 97. Third and Fourth ESD clamp devices 93 and 94 function to protect the internal circuits of the IC from an ESD event occurring on output pin 97. Fifth ESD clamp device 95, electrically connected between first power line $V_{DD}$ and second power line $V_{SS}$, functions to protect the internal circuits from an ESD event occurring on $V_{DD}$ or $V_{SS}$.

In a PS-mode ESD event, a positive ESD pulse occurs on input pin 96 while second power line $V_{SS}$ is grounded. Second ESD clamp device 92 discharges an ESD current from input pin 96 to second power line $V_{SS}$. Likewise, if in a PS-mode ESD event a positive ESD pulse occurs on output pin 97 while second power line $V_{SS}$ is grounded, fourth ESD clamp device 94 discharges an ESD current from output pin 97 to second power line $V_{SS}$.

In an ND-mode ESD event, a negative ESD pulse occurs on input pin 96 while first power line $V_{DD}$ is grounded. First ESD clamp device 91 discharges an ESD current from input pin 96 to first power line $V_{DD}$. Likewise, if in an ND-mode ESD event a negative ESD pulse occurs on output pin 97 while first power line $V_{DD}$ is grounded, third ESD clamp device 93 discharges an ESD current from output pin 97 to first power line $V_{DD}$.

In a PD-mode ESD event, a positive ESD pulse occurs on input pin 96 while first power line $V_{DD}$ is grounded. A parasitic diode formed by an anode (P+) and an N-well (NW) of second ESD clamp device 92 discharges an ESD current. Likewise, if in a PD-mode ESD event a positive ESD pulse occurs on output pin 97 while first power line $V_{DD}$ is grounded, a parasitic diode formed by an anode (P+) and an N-well (NW) of fourth ESD clamp device 94 discharges an ESD current.

In an NS-mode ESD event, a negative ESD pulse occurs on input pin 96 while second power line $V_{SS}$ is grounded. A parasitic diode formed by a cathode (N+) and a substrate (PW) of first ESD clamp device 91 discharges an ESD current. Likewise, if in an NS-mode ESD event a negative ESD pulse occurs on output pin 97 while second power line $V_{SS}$ is grounded, a parasitic diode formed by a cathode (N+) and a substrate (PW) of third ESD clamp device 93 discharges an ESD current.

For fifth ESD clamp device 95, if a positive ESD pulse occurs on anode 954, fifth ESD clamp device 95 discharges an ESD current from anode 954 to $V_{SS}$. If a negative ESD pulse occurs on anode 954, a parasitic diode formed by PW (or p-substrate) 951 and N-well 952 of fifth ESD clamp device 95 discharges an ESD current.

Figure 10A:
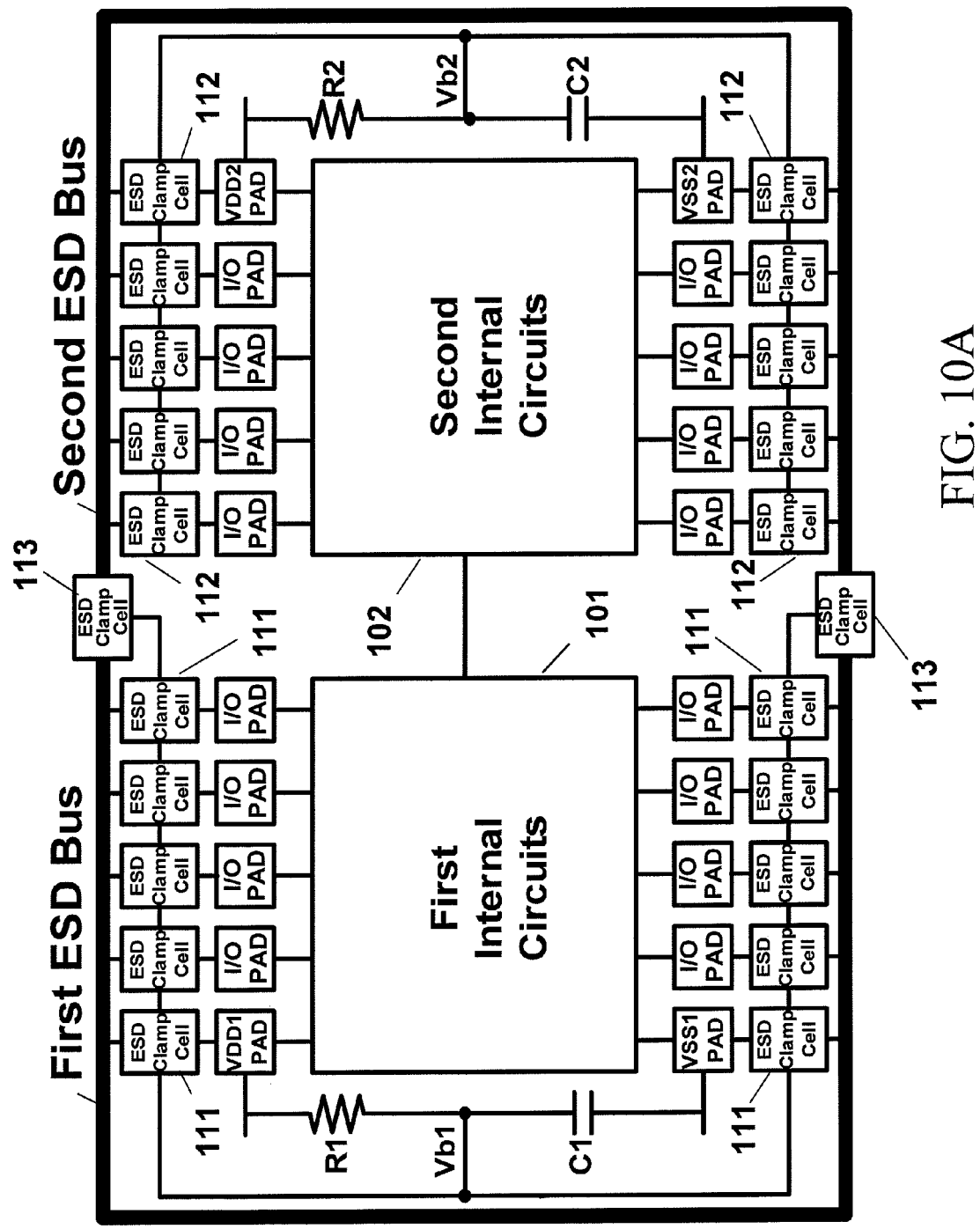
FIG. 10A is a schematic diagram of an ESD protection architecture for a mixed voltage system in accordance with one embodiment of the present invention.

FIG. 10A is a schematic diagram of an ESD protection architecture for a mixed-voltage system in accordance with one embodiment of the present invention. Referring to FIG. 10A, ESD clamp cells 111, 112 and 113 for whole-chip ESD protection are provided in the ESD protection architecture to protect first internal circuits 101 and second internal circuits 102 in the mixed-voltage system from an ESD event. Each of first ESD clamp cells 111 is connected between an input/output (I/O) pad (not numbered) of first internal circuits 101 and a first ESD bus of a first voltage level Vb1. Each of second ESD clamp cells 112 is connected between an input/output (I/O) pad (not numbered) of second internal circuits 102 and a second ESD bus of a second voltage level Vb2, which may not be equal to Vb1. Each of third ESD clamp cells 113 is connected between the first ESD bus and the second ESD bus.

Figures 10B, 10C, 10D:
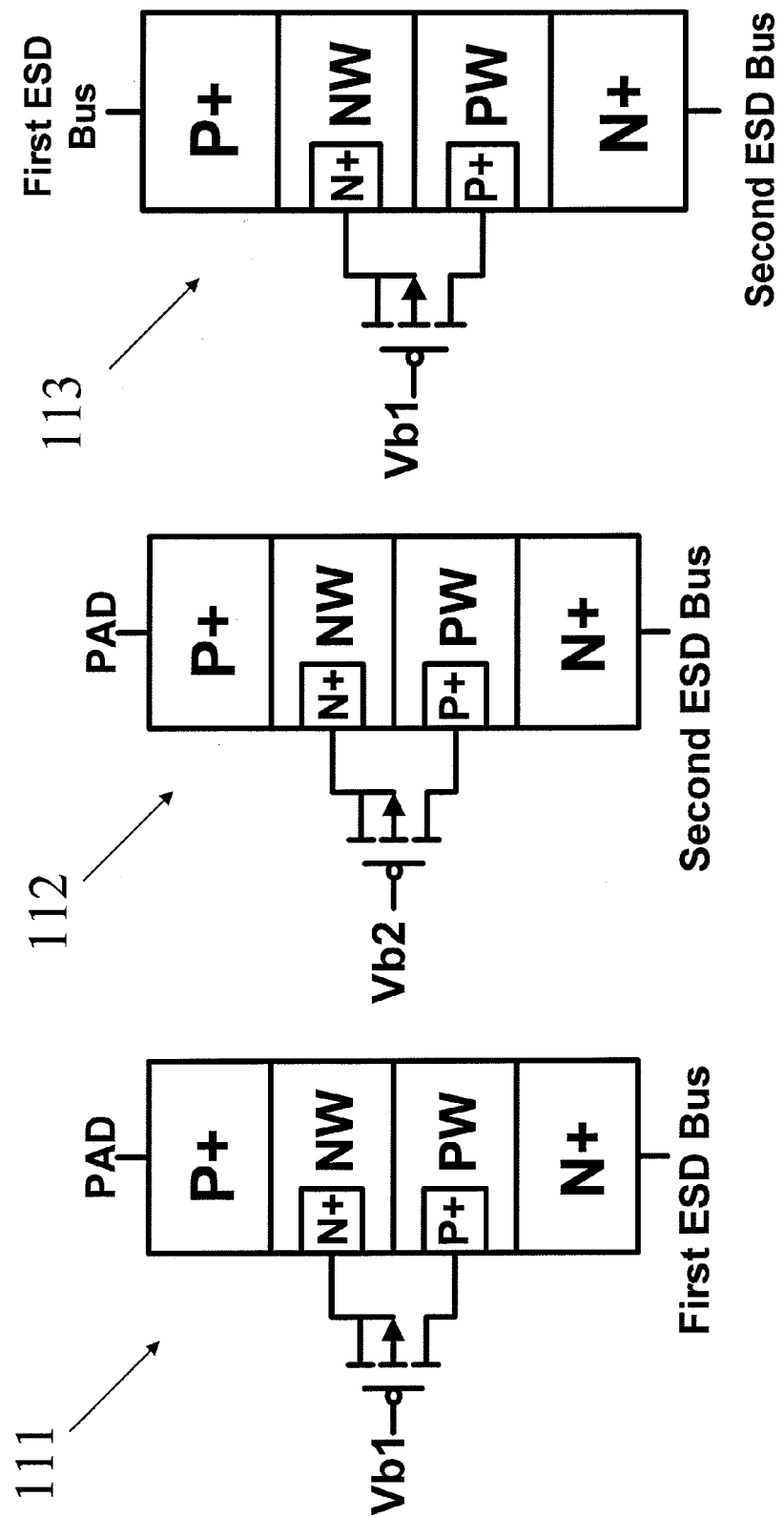
FIGS. 10B, 10C and 10D are diagrams of ESD clamp cells shown in FIG. 10A.

FIGS. 10B, 10C and 10D are diagrams of ESD clamp cells 111, 112 and 113 shown in FIG. 10A. Referring to FIG. 10B, each of ESD clamp cells 111, 112 and 113 includes an SCR device and an embedded PMOS transistor, which have been previously discussed. The SCR device of ESD clamp cell 111 includes an anode P+ connected to a pad, and a cathode N+ connected to the first ESD bus. The embedded PMOS transistor of ESD clamp cell 111 includes a gate (not numbered) electrically connected to Vb1. Referring to FIG. 10C, the SCR device of ESD clamp cell 112 includes an anode P+ connected to a pad, and a cathode N+ connected to second ESD bus. The embedded PMOS transistor of ESD clamp cell 112 includes a gate (not numbered) electrically connected to Vb2. Referring to FIG. 10D, the SCR device of ESD clamp cell 113 includes an anode P+ connected to first ESD bus, and a cathode N+ connected to second ESD bus. A gate (not numbered) of the embedded PMOS transistor is electrically connected to Vb1.

Figure 11A:
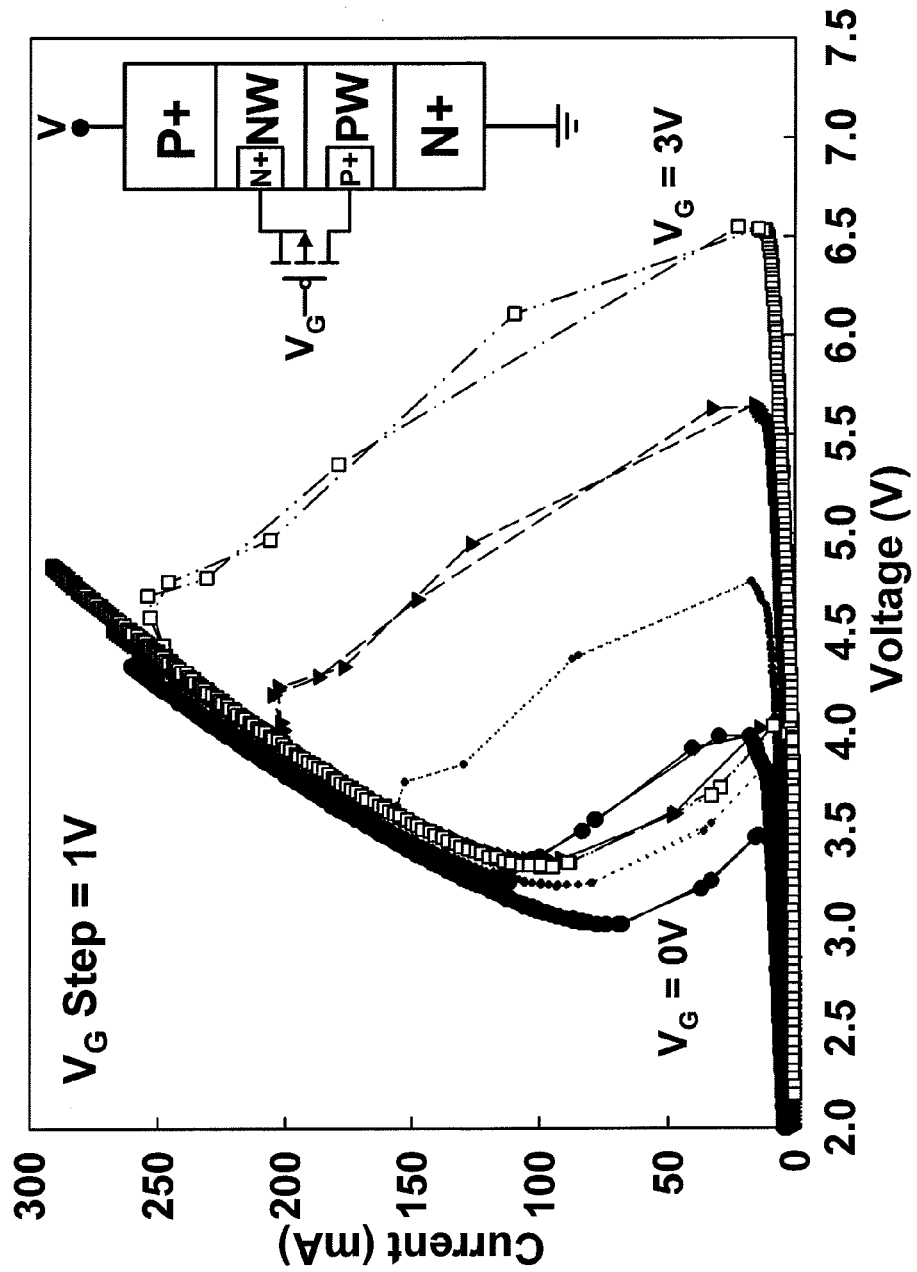
FIGS. 11A and 11B are current-voltage (I-V) curves of an ESD clamp device in accordance with one embodiment of the present invention.
Figure 11B:
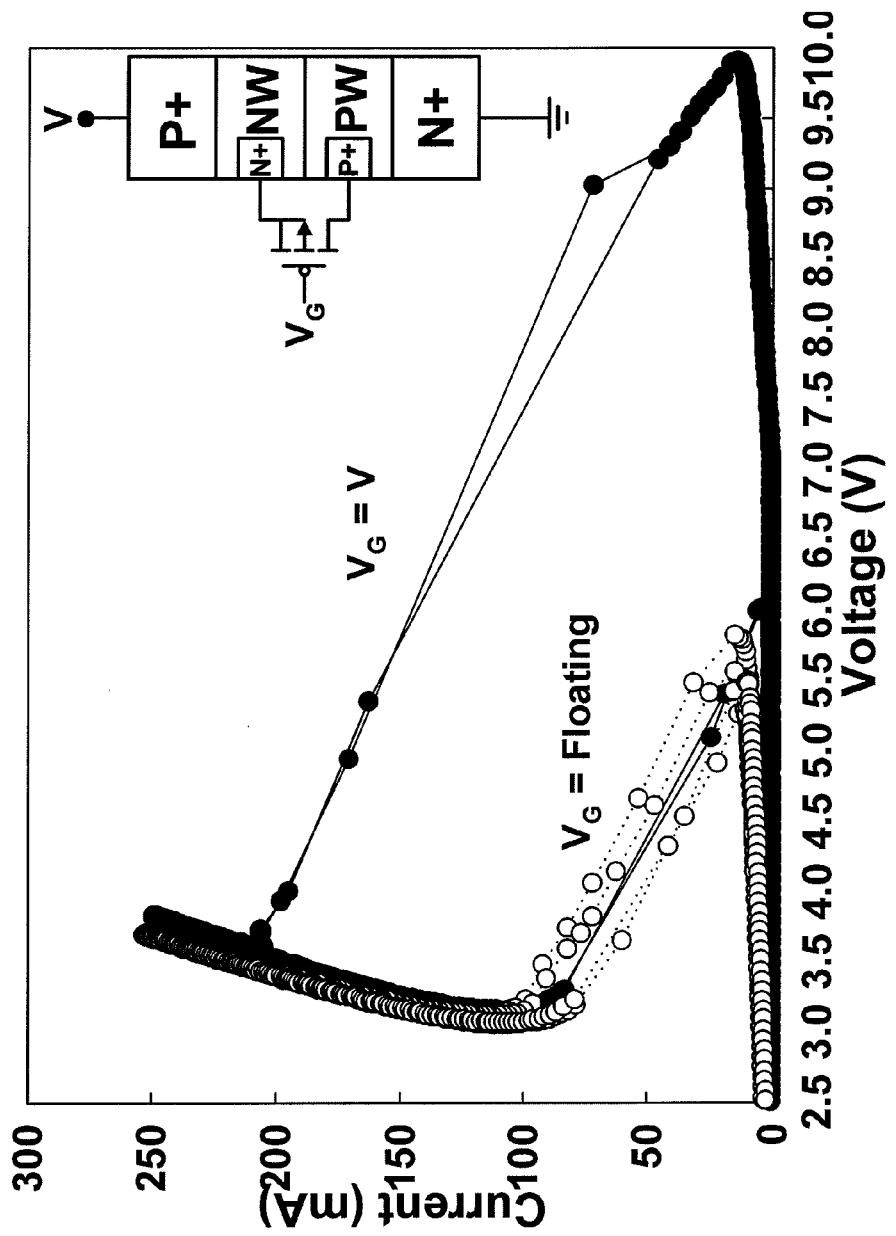

FIGS. 11A and 11B are current-voltage (I-V) curves of an ESD clamp device in accordance with one embodiment of the present invention. Referring to FIG. 11A, the trigger voltage VT1 advantageously decreases as the gate-biased voltage $V_G$ decreases. Referring to FIG. 11B, since the gate of the embedded PMOS transistor is initially kept at 0 volt, the ESD clamp device of the present invention has a relatively low holding voltage.

Figure 12A:
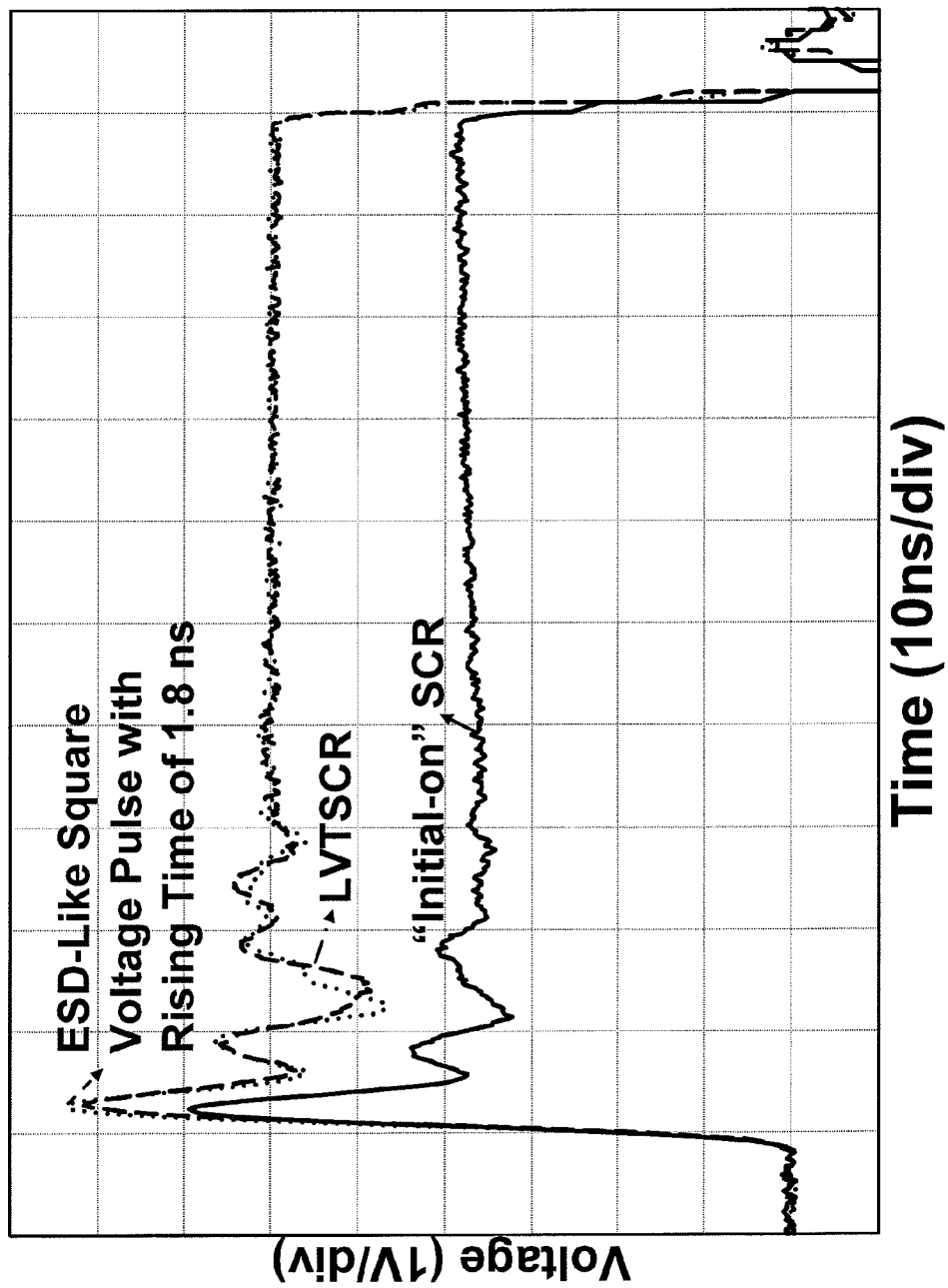
FIGS. 12A and 12B are curves illustrating measurement results of a conventional LVTSCR and an ESD clamp device in accordance with one embodiment of the present invention.
Figure 12B:
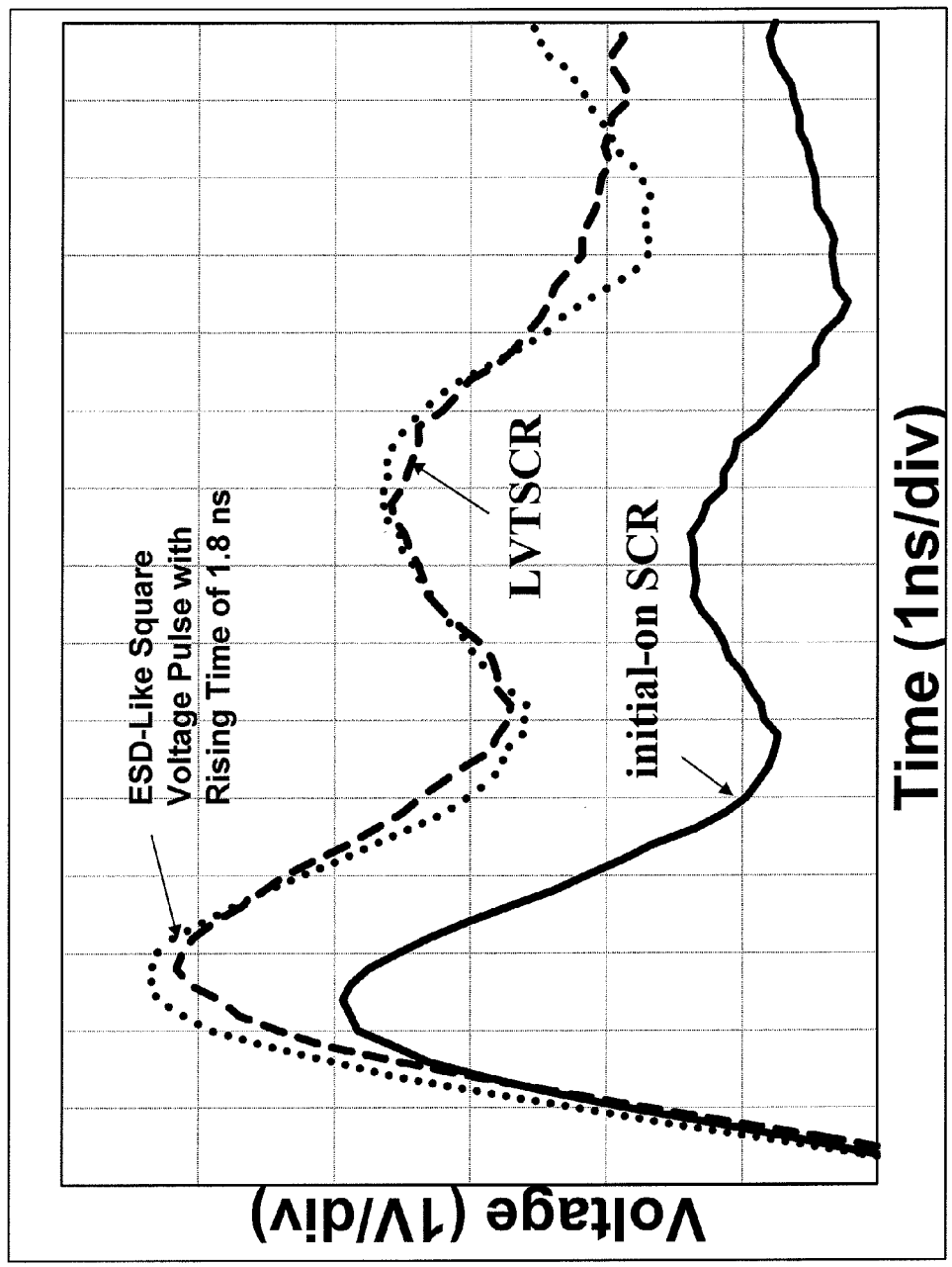

FIGS. 12A and 12B are curves illustrating measurement results of a conventional LVTSCR and an ESD clamp device in accordance with one embodiment of the present invention. Referring to FIG. 12A, when an ESD-like voltage pulse having a rise time of 1.8 ns is zapped on an anode, the ESD clamp device according to the present invention clamps the ESD-like pulse at a lower level. Referring to FIG. 12B, which is an enlarged view of FIG. 12A, the ESD clamp device according to the present invention clamps the ESD-like pulse faster than the conventional LVTSCR. Note that the rise time, 1.8 ns, of the ESD-like pulse is even smaller than a HBM (human body model) ESD pulse, generally ranging between 2 ns and 10 ns.

Figure 13:
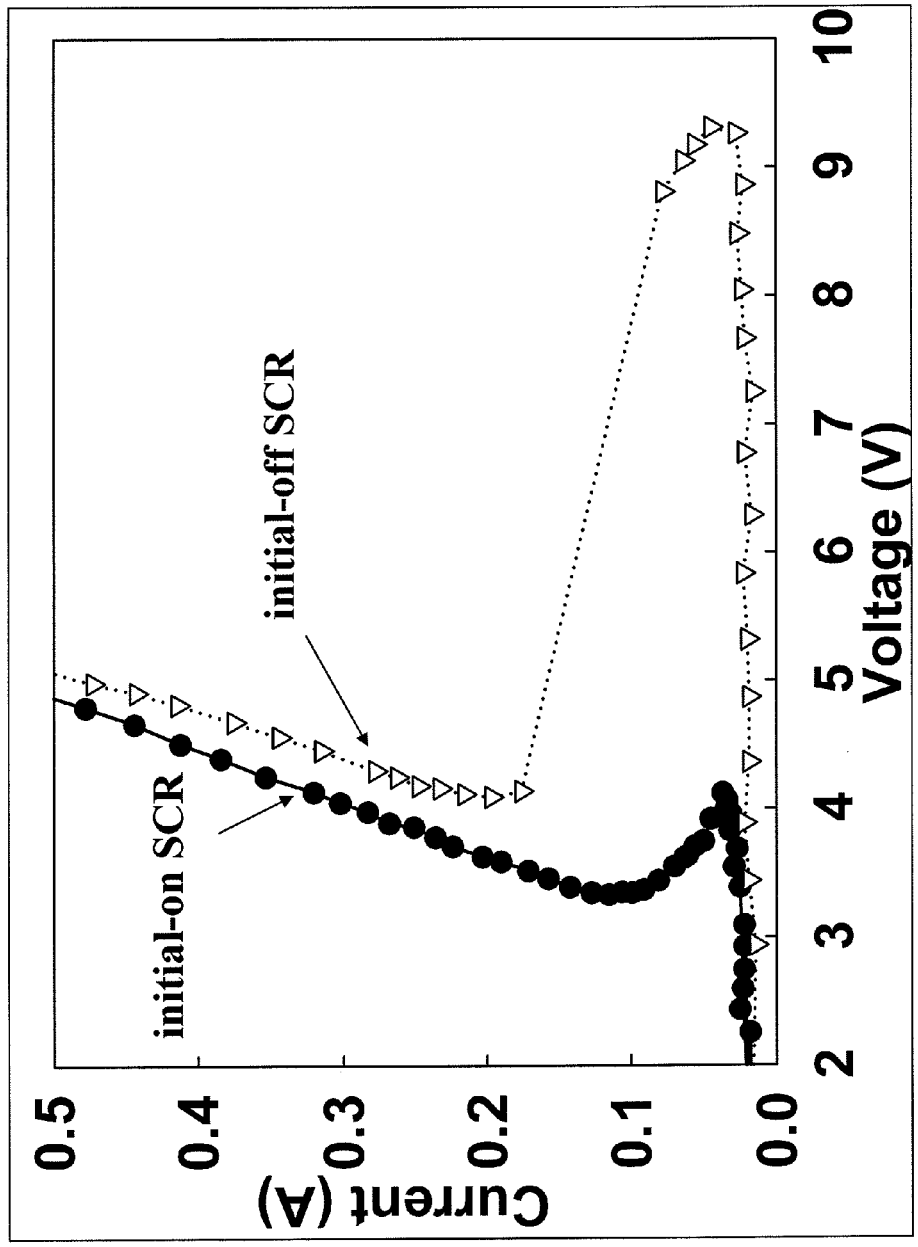
FIG. 13 is an I-V curve illustrating a comparison between an initial-off SCR device and an initial-on SCR device in accordance with one embodiment of the present invention.

FIG. 13 is an I-V curve illustrating a comparison between an initial-off SCR device and an initial-on SCR device in accordance with one embodiment of the present invention in a transmission line pulsing ("TLP") system. Referring to FIG. 13, the trigger voltage Vt1 of the initial-on SCR device according to the present invention may be significantly reduced to approximately 4.3 V, in which the gate of an embedded PMOS transistor is kept at 0 V. The trigger voltage of an initial-off SCR device is as high as approximately 9.5 V, in which the gate of a PMOS transistor is connected to the anode of the SCR to keep the PMOS transistor off. Furthermore, the second breakdown current (It2) of the initial-on SCR device according to the present invention is approximately 4.5 amperes (A), which is also improved. The above-mentioned simulations are made by means of ZapMaster ESD simulator. The failure criterion is defined as 30% I-V curve shifting from its original I-V curves at 1-μA bias. For a device width of 50 μm in a 0.25-μm fully salicided CMOS process, the HBM ESD level for the PMOS-triggered SCR device according to the present invention is approximately 6.0 kV.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

We claim:

1. A semiconductor device for electrostatic discharge (ESD) protection, comprising:
    a semiconductor substrate;
    an n-type well formed in the substrate;
    a p-type metal-oxide-semiconductor (PMOS) transistor formed in the n-type well including a gate, a first diffused region and a second diffused region separated apart from the first diffused region;
    an n-type region formed in the n-type well electrically connected to the first diffused region of the PMOS transistor, wherein the n-type region includes a plurality of sub-regions formed in the n-type well, the plurality of sub-regions being separated apart from each other by the first diffused region of the PMOS transistor; and
    a p-type region formed in the substrate outside of the n-type well, and electrically connected to the second diffused region of the PMOS transistor,
    wherein the gate of the PMOS transistor is kept at a reference voltage level to keep the PMOS transistor at an on state before an ESD event occurs.

2. The device of claim 1, wherein the gate of the PMOS transistor is electrically connected to an ESD detection circuit.

3. The device of claim 2, wherein the ESD detection circuit includes a resistor and a capacitor.

4. The device of claim 1, wherein the second diffused region of the PMOS transistor formed in the n-type well and the p-type region formed in the substrate are formed in an integral p-type area.

5. A semiconductor device for electrostatic discharge (ESD) protection, comprising:
    a silicon controlled rectifier (SCR) including a semiconductor substrate and a well formed in the substrate;
    a p-type metal-oxide-semiconductor (PMOS) transistor formed in the well including a gate;
    an n-type region formed in the well and electrically connected to a first diffused region of the PMOS transistor, wherein the n-type region includes a plurality of sub-regions formed in the well, the plurality of sub-regions being separated apart from each other by the first diffused region of the PMOS transistor;
    a p-type region formed in the substrate outside of the well, and electrically connected to a second diffused region of the PMOS transistor; and
    a detection circuit electrically connected to the gate of the PMOS transistor for keeping the PMOS transistor at an on state before an ESD event occurs.

6. The device of claim 5, wherein the gate of the PMOS transistor is kept at a reference voltage level by the detection circuit before an ESD event occurs.

7. The device of claim 5, wherein the detection circuit includes a resistor and a capacitor.

8. The device of claim 5, wherein the second diffused region of the PMOS transistor formed in the well and the p-type region formed in the substrate are formed in an integral p-type area.

* * * * *